(12) United States Patent
Tong et al.

(10) Patent No.: US 9,235,060 B2
(45) Date of Patent: Jan. 12, 2016

(54) SPECKLE REDUCTION

(75) Inventors: Zhaomin Tong, Borre (NO); Wenhong Gao, Borre (NO); Xuyuan Chen, Borre (NO); Muhammad Nadeem Akram, Borre (NO); Ouyang Guangmin, Borre (NO); Kaiying Wang, Borre (NO)

(73) Assignee: HOGSKOLEN I BUSKERUD OG VESTFOLD (NO)

( * ) Notice: Subject to any disclaimer, the term of this patent is extended or adjusted under 35 U.S.C. 154(b) by 1010 days.

(21) Appl. No.: 13/038,622

(22) Filed: Mar. 2, 2011

(65) Prior Publication Data

US 2011/0216390 A1 Sep. 8, 2011

(30) Foreign Application Priority Data

Mar. 8, 2010 (GB) .................................. 1003822.2

(51) Int. Cl.
 *G02F 1/01* (2006.01)
 *G03B 27/72* (2006.01)
 (Continued)

(52) U.S. Cl.
 CPC *G02B 27/48* (2013.01); *G02F 1/01* (2013.01); *G02B 5/02* (2013.01); *G03F 7/2008* (2013.01);
 (Continued)

(58) Field of Classification Search
 CPC . G03F 7/702; G03F 7/70191; G03F 7/70058; G03F 7/70116; G03F 7/70258; G03F 7/70758; G03F 7/2008; G03F 7/70583; G02B 5/02
 USPC ........ 355/53, 67, 71, 402, 404; 362/277, 279, 362/290, 317, 342; 359/279, 599
 See application file for complete search history.

(56) References Cited

U.S. PATENT DOCUMENTS

| 5,272,473 A * | 12/1993 | Thompson et al. ................ 345/7 |
| 2004/0008399 A1 * | 1/2004 | Trisnadi ........................ 359/279 |

(Continued)

FOREIGN PATENT DOCUMENTS

| CN | 1313863 C | 5/2007 |
| EP | 1 328 128 A1 | 7/2003 |

(Continued)

OTHER PUBLICATIONS

Search Report Under Section 17(5) dated Jun. 21, 2010 issued by the U.K. Patent Office in related U.K. Application No. GB1003822.2 (3 pages).

(Continued)

*Primary Examiner* — Evelyn A Lester
(74) *Attorney, Agent, or Firm* — Robert P. Michal, Esq.; Carter, DeLuca, Farrell & Schmidt, LLP

(57) ABSTRACT

Speckle reduction apparatus includes a radiation path and a mask arranged within the radiation path. The mask includes an array of electrically controllable cells configured to form a pattern on the mask that varies with time. The speckle reduction mask includes a first linear array including first parallel lines arranged to change the phase of incident radiation, and a second linear array including second parallel lines arranged to change the phase of incident radiation and further arranged such that cells are formed at the intersections of the first parallel lines and the second parallel lines. The speckle reduction mask includes a $N_1 \times N_2$ array of cells, A, formed according to:

$$A^T A = \beta \delta_{k,l},$$

where $A^T$ is the transpose of A, $\beta$ is a real and positive constant, $d_{k,l}$ is Kronecker delta and $N_1 \neq N_2$.

17 Claims, 15 Drawing Sheets

(51) Int. Cl.
    *F21S 8/00*     (2006.01)
    *G02B 27/48*     (2006.01)
    *G03F 7/20*     (2006.01)
    *G02B 5/02*     (2006.01)

(52) U.S. Cl.
    CPC ............ *G03F 7/702* (2013.01); *G03F 7/70058* (2013.01); *G03F 7/70116* (2013.01); *G03F 7/70191* (2013.01); *G03F 7/70258* (2013.01); *G03F 7/70583* (2013.01); *G03F 7/70758* (2013.01)

(56) References Cited

U.S. PATENT DOCUMENTS

| | | |
|---|---|---|
| 2004/0080804 A1* | 4/2004 | Vincent et al. ............... 359/265 |
| 2008/0106779 A1 | 5/2008 | Peterson et al. |
| 2008/0212034 A1 | 9/2008 | Aksyuk et al. |
| 2009/0033814 A1 | 2/2009 | Khan |
| 2009/0257028 A1 | 10/2009 | Osawa et al. |

FOREIGN PATENT DOCUMENTS

| | | |
|---|---|---|
| WO | 03/001281 A1 | 6/2002 |
| WO | WO 2008/056318 A2 | 5/2008 |
| WO | 2009/013597 A2 | 1/2009 |

OTHER PUBLICATIONS

Examination Report under Section 18(3) dated Apr. 25, 2014 issued by the U.K. Intellectual Property Office in related UK Application No. GB1003822.2 (4 pages).
Office Action dated Apr. 23, 2014 issued by the State Intellectual Property Office of People's Republic of China in related CN Application No. 201110054854.4 (14 pages).
Chinese Office Action dated Jul. 7, 2015, Application No. 201110054854.4 and English translation, 22 pages.
Communication entitled Examination Report under Section 18(3) mailed Dec. 8, 2014 which was issued in a related Great Britain Application No. 1003822.2 (3 pages).
Communication entitled Search and Examination Report under Section 17 and 18(3) mailed Dec. 8, 2014 which was issued in a related Great Britain Application No. 1418993.0 (5 pages).

* cited by examiner

```
┌─────────────────────────────────────┐
│   Calculate the count of largest    │
│ independent speckle images within   │
│ one resolution spot can be achieved,│
│          for example N.             │
└─────────────────────────────────────┘
                  ↓
┌─────────────────────────────────────┐
│  Choose suitable OAs A and B, where │
│ the product of their factors must be N.│
└─────────────────────────────────────┘
                  ↓
┌─────────────────────────────────────┐
│   Use Kronecker algebra to construct│
│      OA C and generate the two      │
│   dimensional phase pattern using C,│
│   where 1 corresponds 0 radian phase│
│   change, and -1 corresponds π radian│
│           phase change.             │
└─────────────────────────────────────┘
                  ↓
┌─────────────────────────────────────┐
│ Use rows of the two dimensional phase│
│ pattern as phase mask sequentially and│
│ split the two dimensional phase pattern│
│ to a pair of one dimensional orthogonal│
│  phase patterns according to rows in │
│            OAs A and B.              │
└─────────────────────────────────────┘
```

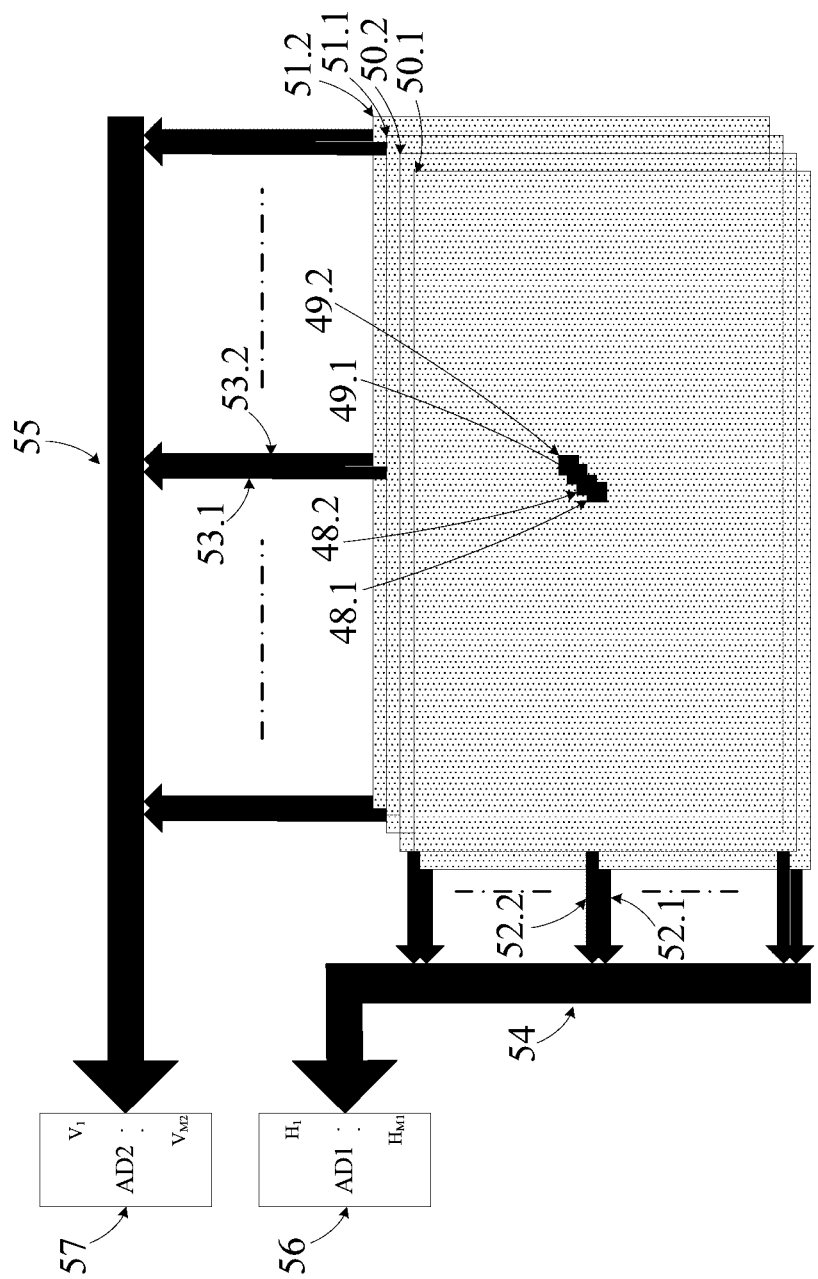

SPECKLE REDUCTION

CROSS REFERENCE TO RELATED APPLICATION

This application claims the benefit under 35 USC 119 of U.K. Patent Application GB1003822.2 filed Mar. 8, 2010, the entire disclosure of which is incorporated herein by reference.

FIELD OF THE INVENTION

The presented invention relates to the reduction of speckle and especially for use with laser illumination, such as a laser display system.

BACKGROUND OF THE INVENTION

Speckle is induced by light interference emerging from a screen. As shown in FIG. 1, the presence of speckle results in a granular pattern and can mask image formation.

The origin of this granular pattern is the extremely rough screen surface on the scale of the incident (e.g. optical) wavelength. Under illumination of coherent radiation, such as lasers, the wave reflected from such a surface consists of contributions from many independent scattering areas. Propagation of this reflected light to a distant observation point results in the addition of these various scattered components with relative delays, which may vary from several to many wavelengths. Interference of these de-phased but coherent wavelets results in the granular pattern known as speckle. Specifically, the constructively interfered wavelets lead to bright spots; the destructively interfered wavelets lead to the dark spots; the partially constructively interfered and partially destructively interfered wavelets lead to the intermediate or grey spots.

In order to improve the image quality in a laser display system, or any other system that may encounter speckle, it is necessary to reduce the speckle effect. The amount of speckle may be measured or calculated by Contrast Ratio (CR): $CR=s/I$, where I is the mean intensity and s is the root mean square intensity fluctuation. Speckle can be reduced by creating a number of independent speckle patterns and averaging them out within an integration time of a detector viewing the image, such as human eyes. Speckle contrast may be reduced to $1/\sqrt{N}$ by superimposing N independent speckle patterns within the integration time. Speckle reduction may be achieved by using a vibrating screen. However, this technique may not be very practical due to the required high-power actuator. Speckle can also be reduced at the illumination source, by using multiple sources such as laser arrays or wide-band laser, for example. However, the special designed laser arrays may increase costs accordingly.

US2004/0008399 describes a method to suppress the speckle by creating N independent speckle patterns using a Hadamard Matrix (HM) phase mask as the diffuser, which is located on an intermediate image plane. A large HM phase mask is etched on a fused silica plate and then mechanically moved to create different speckle patterns at the screen when a laser beam passes through. However, the mechanical components required in this approach limit the technique and are impractical, especially when a high order HM is introduced to achieve a higher degree of speckle reduction. Using mechanical vibration, an actuator with a larger vibrating distance and a high working frequency is required.

Therefore, there is required a speckle reduction technique that overcomes these problems.

SUMMARY OF THE INVENTION

According to a first aspect, there is provided a speckle reduction apparatus comprising: a radiation path and a mask arranged within the radiation path, the mask comprising an array of electrically controllable cells configured to form a pattern on the mask that varies with time. Electrical control of each cell removes the need to mechanically move the mask, which instead changes pattern, typically at the same rate or faster than an integration time of a detector. In other words, the mask may remain stationary or static with respect to the radiation path in use. The radiation may be light of any wavelength including, for example, radio waves, microwaves and ultraviolet waves. In particular, speckle may be a present from lasers or other coherent sources. The radiation may also be sound waves and for example, ultrasonic radiation used in ultrasound imaging.

Preferably, the pattern may be one of a phase pattern and an intensity pattern. As speckle is due to phase effects then a phase pattern on the mask may be particularly advantageous.

Preferably, the mask may be arranged to be stationary with respect to the radiation path. This further reduces the requirements of moving parts.

Optionally, the array of cells may comprise a different number of rows to the number of columns. In other words, the mask may consist of cells of any arbitrary number and can be non-square. This has particular benefits and this more flexible mask can achieve higher theoretical speckle suppression, which may be determined by the numerical aperture of the projection lens and the image lens of the detector, with a finite step change of the cells states.

Advantageously, the apparatus may further comprise electrodes connectable between each cell in the mask and a controller. Other types of electrical connections may be made.

Preferably, the speckle reduction apparatus may further comprise a control bus connecting the electrodes to the controller.

Optionally, the speckle reduction apparatus may further comprise two or more masks. For example, two, four, six, eight or more masks may be used. Multiple masks may form a composite single mask or be placed in series, i.e. overlap or cover each other (partially or fully), in the radiation or light path. Having two or more masks may reduce the number and requirements for electrodes and electrical control of the cells. These multiple masks may have linear arrays or other pattern types.

Optionally, the mask may be formed from a first linear array and a second linear array. This further reduces the requirements for electrodes and electrical control. Further linear arrays may also be used including three to eight or more and preferably, four, six or eight arrays. The linear arrays may be formed of closely packed lines or in particular, adjacent lines of the same size without gaps between them.

Preferably, the first array may comprise first parallel lines and the second array may comprise second parallel lines, arranged at a non-zero angle to the first parallel lines. Therefore, the first parallel lines will crossover or intersect (in the radiation path) with the second parallel lines. The non-zero angle may be anywhere from 0 to 90° forming different shaped masks (e.g. three masks at 60° or four masks a 45°, or any other angle or number of masks, for example) but preferably at 90° to form square or rectangular masks.

Preferably, each parallel line may be arranged to selectively change the phase of incident radiation. Therefore, the resultant phase change encountered by the incident radiation will be the sum of the phase changes at each phase plate.

Preferably, the electrically controllable cells may be formed at intersections between the first parallel lines and the second parallel lines.

Preferably, the second parallel lines may be arranged substantially perpendicular to the first parallel lines.

Optionally, the second linear array may be in contact with and overlaid on the first linear array. However, the two (or more) linear arrays maybe be separated. Alternatively, there may be one or more additional optical components separating the linear arrays.

Preferably, the speckle reduction apparatus may further comprise a first control bus connecting each line of the first parallel lines to a controller and a second control bus connecting each line of the second parallel lines to the controller. Alternatively, a single controller may be used for all lines or ribbons.

Preferably, the overall phase change of radiation passing through each cell of the mask is 0 or p rad. Where the mask is formed from two (or more) separate masks then at an intersection or cell, the phase change will be the sum of the two (or more) individual phase changes. For example, at an intersection of two lines each having a phase change of p rad, the resultant phase change will be 2p, which is also 0 as the resultant or transmitted radiation will be back in phase with the incident radiation. In a further example, a horizontal line may have a phase change of p but a vertical line that intersects with the horizontal line may have a 0 phase change. In this case, the resultant phase change will be p.

Optionally, the mask may be a transmission mask or a reflection mask.

Preferably, the cells of the array of electrically controllable cells have two states. For example, transmit or reflect at 0 and p rad phase change.

Preferably, the pattern on the mask that varies with time includes a Hadamard matrix or an orthogonal array. These are particularly effective and efficient patterns as they require fewer changes per integration time (of the detector or eye) to reduce speckle than other patterns especially random patterns.

Optionally, the mask may be formed from a material selected from the group consisting of ceramic, para-electric, silica and glass. Other materials may also be suitable.

Preferably, the speckle reduction apparatus may further comprise a beam expander arranged within the radiation path.

Preferably, the mask may be located substantially at a focal point or an intermediate image plane within the optical or radiation path. In particular, this focal point may be within a projection lens in a display system, for example.

According to a second aspect, there is provided a speckle reduction mask comprising: a first linear array comprising first parallel lines arranged to change the phase of incident radiation, and a second linear array comprising second parallel lines arranged to change the phase of incident radiation and further arranged such that cells are formed at the intersections of the first parallel lines and the second parallel lines. For example, the first parallel lines may be at a non-zero angle to the second parallel lines.

Preferably, the phase change of each parallel line may be independently and electrically controllable.

Preferably, the first parallel lines may be at a angle of 90° to the second parallel lines. However, other angles may be used.

Preferably, the overall phase change of radiation passing through each cell of the mask may be one of 0 or p rad.

Optionally, the cells are arrangeable to form a phase pattern generated from an orthogonal array. A Hadamard matrix may be one particular form of orthogonal array.

Optionally, the second linear array may be in contact with and overlaid on the first linear array.

Preferably, the speckle reduction mask may further comprise an electrical connection to each parallel line. The use of parallel lines or ribbons reduces the total requirement of electrical connections compared with the requirements of a two-dimensional mask with many individual cells.

According to a third aspect, there is provided a speckle reduction mask comprising a $N_1 \times N_2$ array of cells, A, formed according to:

$$A^T A = \beta \delta_{k,l}, \qquad (1)$$

where $A^T$ is the transpose of A, $\beta$ is a real and positive constant, $d_{k,l}$ is Kronecker delta and $N_1 \neq N_2$.

Preferably, each cell in the array is controllable between two states.

Preferably, each of the two states is a phase change for incident radiation.

Optionally, the array of cells may be formed from two or more linear arrays.

Preferably, the speckle reduction mask may be arranged to form a time-varying pattern of cells. For example, these cells may occur at intersections of lines for each linear array.

According to a fourth aspect, there is provided a speckle reduction apparatus having a mask as described above.

According to a fifth aspect, there is provided a laser display, laser printer, laser lithography apparatus, microwave radar apparatus or ultrasound imager comprising the speckle reduction apparatus described above.

According to a sixth aspect, there is provided a method of designing a speckle reduction mask as described above.

Further benefits include improved size flexibility. Different speckle patterns can be created by mechanically moving or electrically driving any of the mask. In order to electrically control the real-time change of the mask, a two-dimensional phase mask may be replaced by two (or more) one-dimensional phase masks, which provide a similar function. Using this method, the number of electrodes required to drive each cell in a mask may be significantly reduced.

In one example, a laser display system using a Digital Micromirror Device (DMD) as the display chip an orthogonal array phase mask may be used as a speckle reduction diffuser. Other types of display chips, such as Liquid Crystal on Silicon (LCoS), Spatial Optical Modulator (SOM), and Grating Light Valve (GLV) are also applicable in such a system.

The electrical control of the state of cells within the mask may be implemented in hardware or software or a combination of the two. The software may be executed on in a suitable operating environment such as semiconductor processor, for example.

Although separate aspects have been described, all of the features of each aspect are freely interchangeable.

BRIEF DESCRIPTION OF THE DRAWINGS

These and other characteristics of the invention will be clear from the following description preferred embodiments, provided as a non-restrictive examples, with reference to the attached drawings wherein:

FIG. 3a shows a schematic diagram of the speckle reduction mask of FIG. 2;

FIG. 3b shows a mathematical representation of a portion of the speckle reduction mask of FIG. 3a;

FIG. 3c shows a schematic diagram of one cell of the speckle reduction mask of FIG. 3a during a first time period;

FIG. 3d shows a schematic diagram of one cell of the speckle reduction mask of FIG. 3a during a second time period;

FIG. 3e shows a schematic diagram of one cell of the speckle reduction mask of FIG. 3a during a third time period;

FIG. 3f shows a schematic diagram of one cell of the speckle reduction mask of FIG. 3a during a fourth time period;

FIG. 4 shows a graphical illustration of Kronecker Algebra used to generate the speckle reduction mask of FIG. 3a;

FIG. 5 shows a flow chart of a method for generating the speckle reduction mask of FIG. 2;

FIG. 8b shows a graphical representation of the change of state with time of the electrical signals of FIG. 8a;

FIG. 8c shows a numerical representation of speckle images projected onto the screen of FIG. 2 when controlled by the electrical signals of FIG. 8b;

FIG. 9b shows a graphical representation of the change of state with time of the electrical signals of FIG. 9a;

FIG. 9c shows a numerical representation of speckle images projected onto the screen of FIG. 2 when controlled by the electrical signals of FIG. 9b;

FIG. 11 shows a schematic diagram indicating the flow of electrical signals within an electrical circuit used to control the four one-dimensional orthogonal arrays of FIG. 10;

FIG. 12b shows a graphical representation of the change of state with time of the electrical signals of FIG. 12a;

FIG. 13b shows a graphical representation of the change of state with time of the electrical signals of FIG. 13a.

DETAILED DESCRIPTION OF THE PREFERRED EMBODIMENTS

Figure 1:
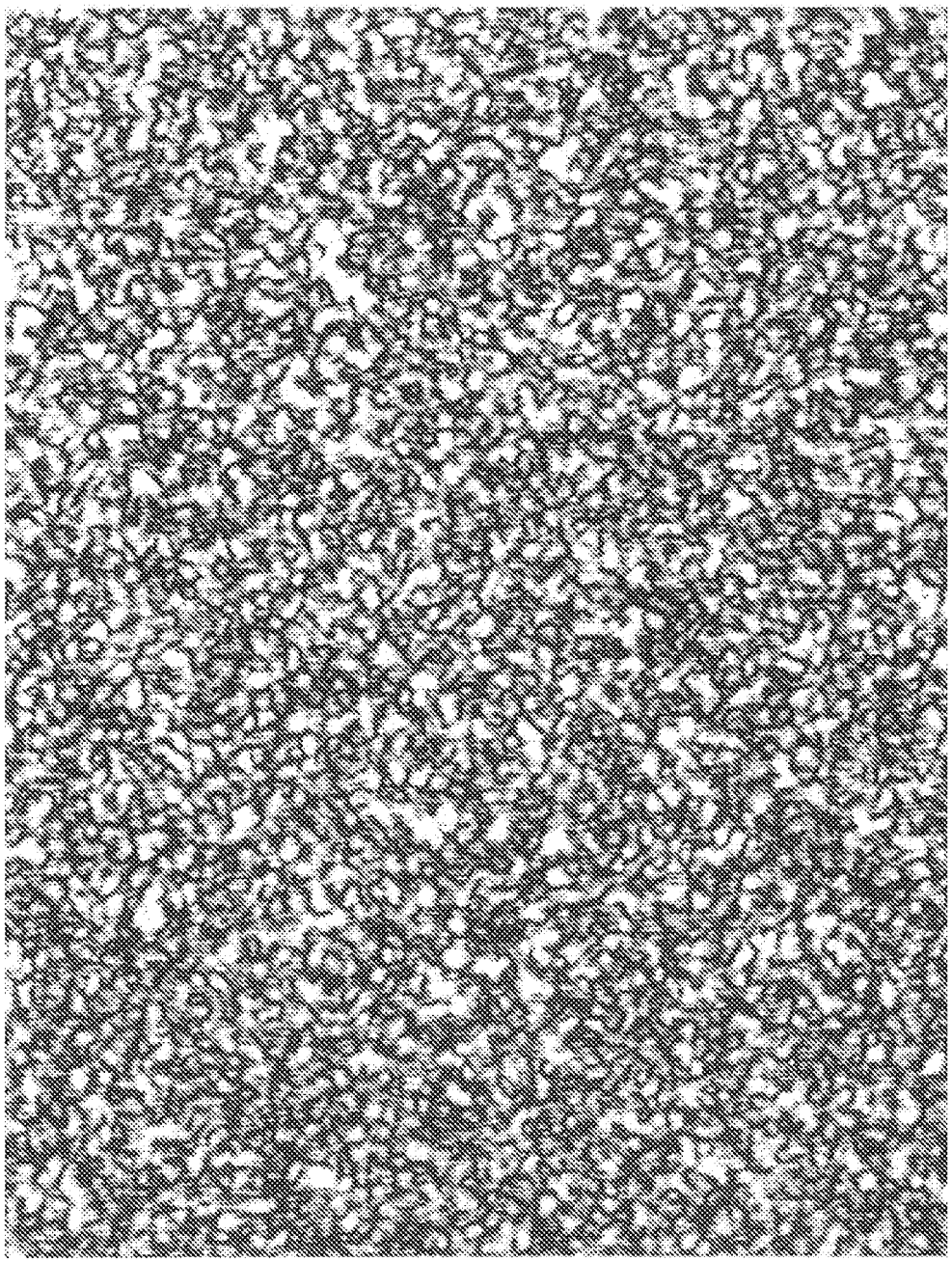
FIG. 1 shows a photograph of a speckle pattern.

FIG. 1 shows a speckle pattern generated from a coherent source of radiation, such as light from a laser, scattering off a rough surface. The dark regions correspond with destructive interference and the bright spots correspond with constructive interference effects.

Figure 2:
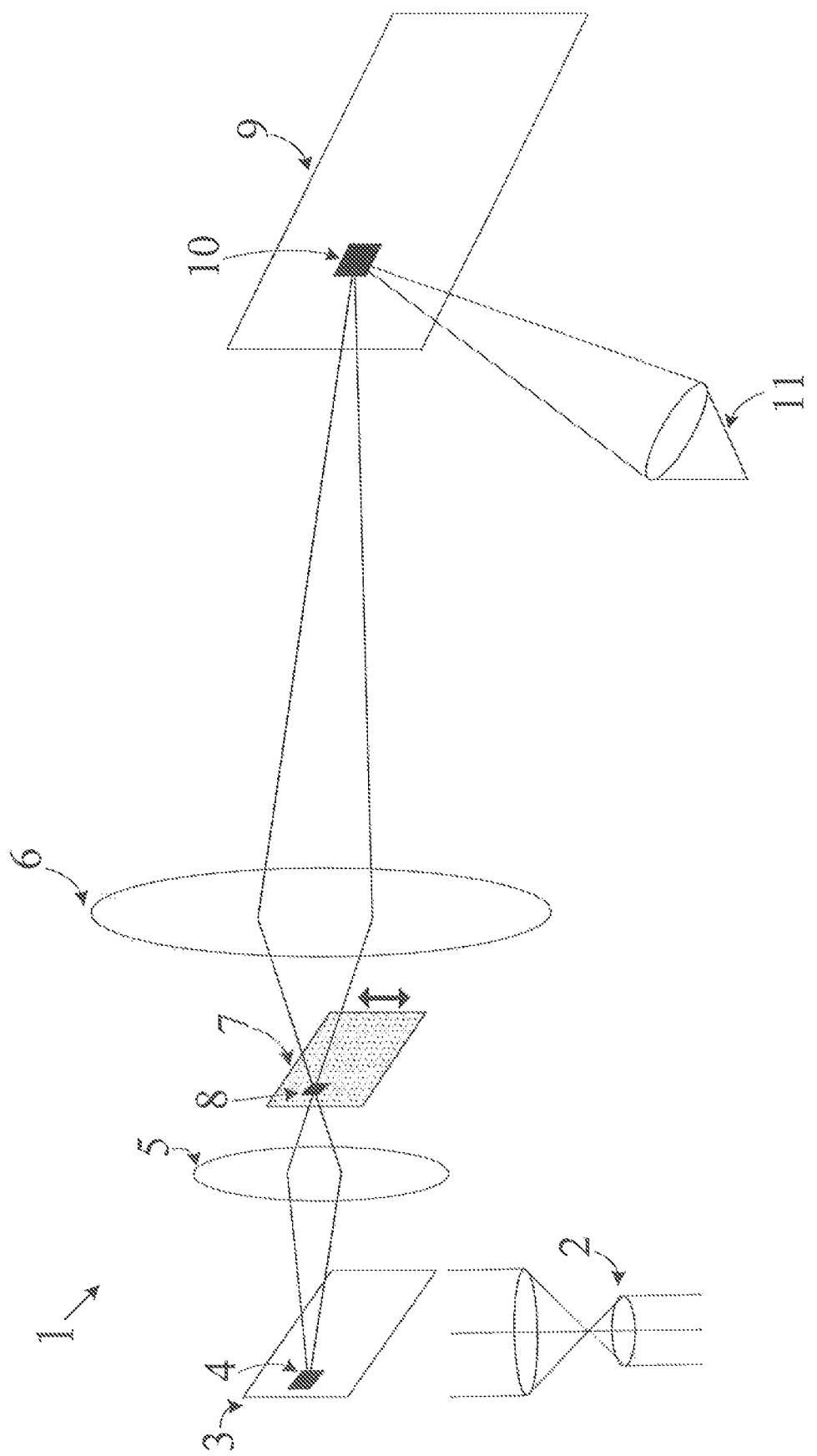
FIG. 2 shows a schematic diagram of example optical geometry used within a laser projector, including a speckle reduction mask.

FIG. 2 shows a display system 1 that includes a phase diffuser at an intermediate image plane of a projection lens 5, 6 (acting as a beam expander). The display system 1 shown in FIG. 2 may include a laser source 2, a digital micromirror device (DMD) 3, which acts as a light modulator, a screen 9 and a detector 11. The phase diffuser or speckle reduction mask 7 may be in the form of a binary phase mask in configured as an orthogonal array (OA) having parameters $N_1$, $N_2$, s and t, where $N_1$ represents runs, $N_2$ represents factors, s represents levels and t represents strength. When a monochromatic laser is expanded and illuminated at the DMD chip 3, a full frame monochromatic image may be formed on the phase diffuser or speckle reduction mask 7. For each pixel 4 in the DMD chip 3, there is a corresponding $N_H \times N_V$ subcell 8 in the phase mask 7, where $N_H \times N_V = N_2$. When the laser beam 2 passes through the phase mask 7, a phase change for each element in the subcells 8 may be either 0 or p rad. The DMD pixel 4 may then be projected on to the screen 9 with a corresponding screen pixel 10 and detected by the light intensity detector 11. By mechanically vibrating the phase mask and keeping other parts of the system stable and still, different speckle patterns may be created on the screen 9 at different times. The time taken to change the speckle pattern is configured to be shorter than or equal to the integration time of the detector (e.g. the eye of a viewer). For instance, during the integration time, $N_1$ speckle patterns may be created or changed. A resolution spot of the detector may be a pixel 10 and the number of elements within the pixel 10 is $N_2$. Speckle, as detected in the detector 11, may therefore be suppressed by $1/N_2^{1/2}$ by adding these $N_1$ speckle patterns together.

In Speckle Phenomena in Optics: Theory and Applications, by Joseph W. Goodman at Chapter 6, page 222, Eq. (6-66), the designs of phase masks with certain orthogonality properties are discussed. In particular, this book considers the illumination conditions of a set of M diffuser structures such that:

$$\sum_{m=1}^{M} P_k^{(m)} P_l^{(m)*} = \beta \delta_{k,l}, \qquad (2)$$

where $\beta$ is a real and positive constant and $d_{kl}$ is a Kronecker delta.

Using an OA to generate the phase mask 7 reduces the number of pattern changes required compared to a random diffuser.

Alternatively, mechanical vibration of the phase mask 7 may be avoided by using a motionless phase mask, which can be controlled electrically. In other words, the pattern on the phase mask may be changed by controlling each cell. However, due to the huge number of electrodes required to control each element or cell (corresponding to the number of cells to be controlled in the speckle reduction mask 7), such an arrangement may be difficult to implement.

Figure 7:
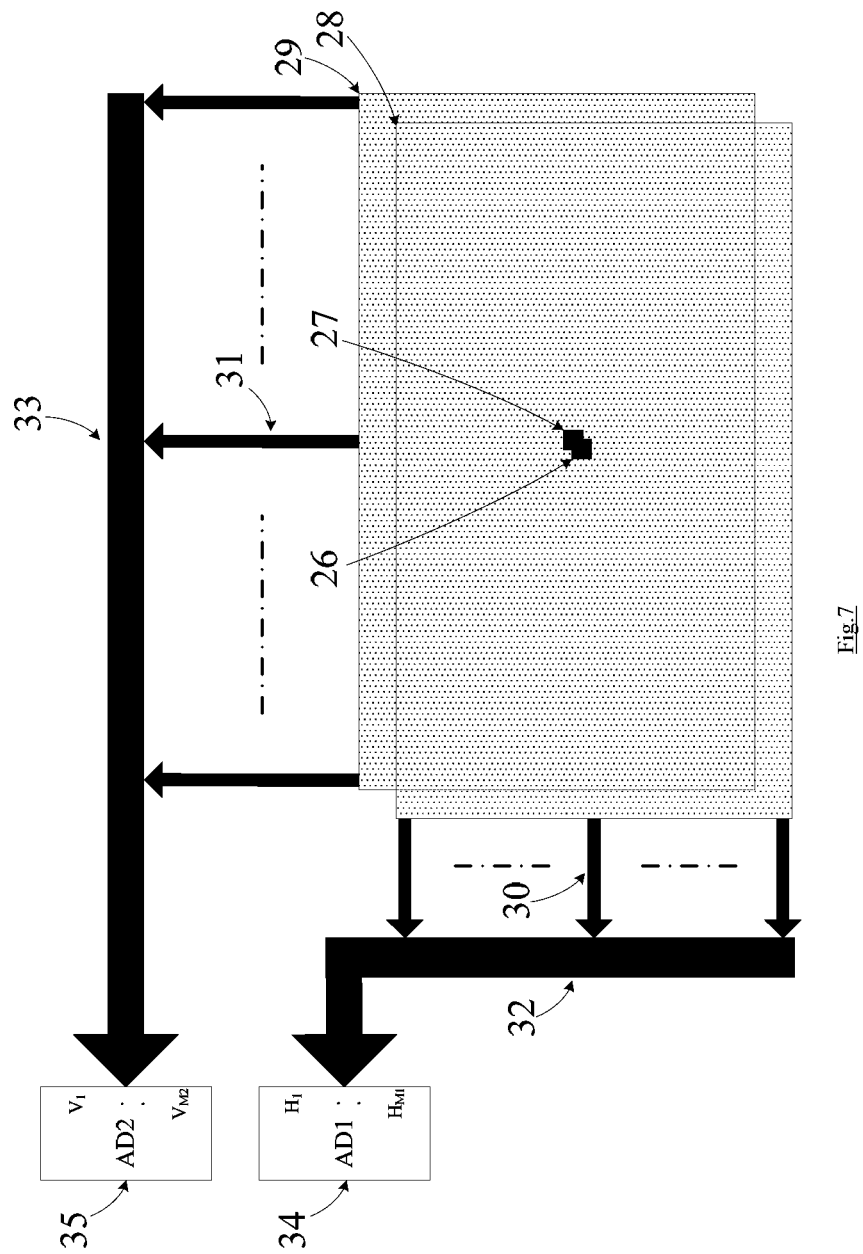
FIG. 7 shows a schematic diagram of an electrical circuit in simplified form, used to control the speckle reduction mask of FIG. 2.

In order to overcome this difficulty, a two-dimensional phase mask 7 may be implemented as two one-dimensional phase masks 28, 29, as shown in FIG. 7. These may be known as Kronecker algebra of orthogonal arrays (OA). The one-dimensional phase masks 28, 29 may be overlaid, in contact or separated but may be arranged such that the laser beam passes through both masks 28, 29. The one-dimensional phase masks 28, 29 may be formed having parallel lines or ribbons as columns or rows running across them. The parallel lines of the first mask may be perpendicular to the parallel lines of the second mask. Rather than requiring a separate electrode to control each cell in a two-dimensional mask, electrodes are only required for each of the lines in the two one-dimensional mask 28, 29. Therefore, the number of electrodes may be reduced.

As a special case of orthogonal array, a Hadamard matrix, constructed by the Sylvester method, may be formed by using two one-dimensional plates. Furthermore, by using more than two one-dimensional phase masks the number of required electrodes may be further reduced.

Application and Construction of the Phase Mask Obtained from OA

Mechanical Vibration of One Two-Dimensional Phase Mask

When designing a binary orthogonal diffuser for speckle reduction, the orthogonal characteristics of and OA are particularly useful, i.e. for an $N_1 \times N_2$ OA: A with two levels (−1 and 1 or p and 0 phase change), all the columns are orthogonal, then following relationship can be obtained $$A^T A = \beta \delta_{k,l},  \quad (3)$$

where $\beta$ is a real and positive constant and $d_{kl}$ is Kronecker delta. Such feature will make the speckle patterns projected after the binary diffuser satisfy the following relationship $$\sum_{m=1}^{M} P_k^{(m)} P_l^{(m)*} = \beta \delta_{k,l},  \quad (4)$$

where $P_k^{(m)}$ and $P_l^{(m)}$ represents the field projected onto the screen by the kth and lth projector-lens resolution elements during the mth diffuser realization.

With this particular diffuser ($N_1 \times N_2$ OA), with N step changes of the phase diffuser during the integration time, speckle CR may be decreased to $1/N_2^{1/2}$. Furthermore, with this configuration, because the OA is more flexible compared with a Hadamard matrix whose orders should be 1, 2 or a multiple of 4, there is further flexibility to match the dimensions of the mask to the required number of projection lens resolution elements within one eye (or detector) resolution spot.

Figure 3:
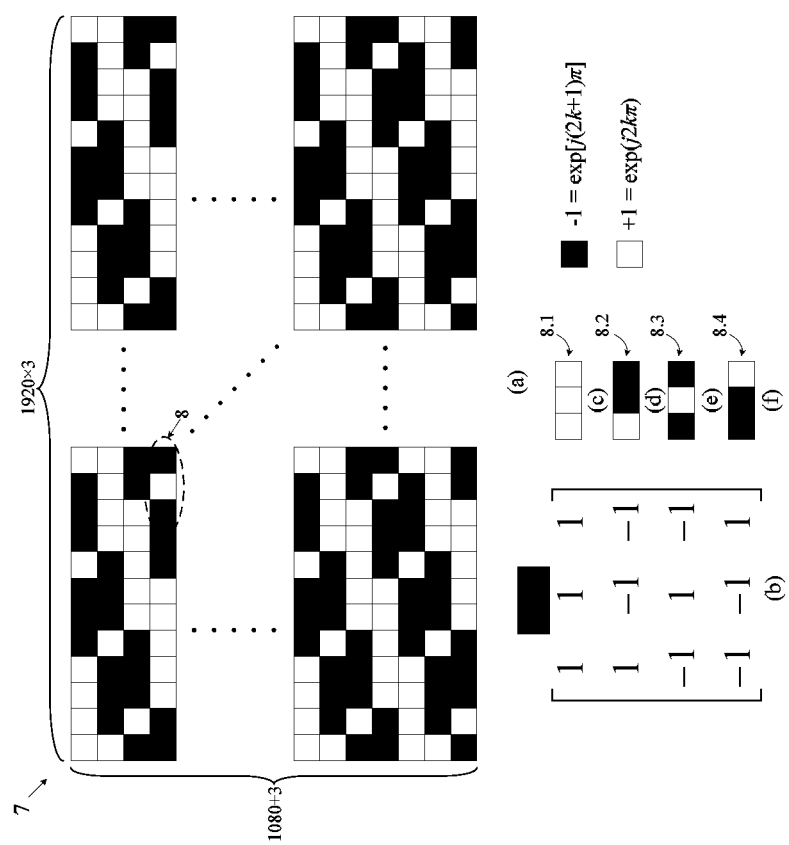

One example of the phase mask 7 obtained in the form of an OA is shown in FIG. 3a. It is compatible with a DMD display chip 3 having 1920×1080 pixels. To simplify the illustrations, an OA (4, 3, 2, 2) (FIG. 3b) is used as the origin of phase mask 7 and we have assumed that the projector pixel 4 is a rectangle with width/length=⅓, where 1 (white) and −1 (black) represent 0 and p radian phase change, respectively. The pattern 8 of the mask 7 are formed by rows of the OA (4, 3, 2, 2), as shown in FIG. 3b. A pattern 8 is use for each resolution spot (or pixel) 10 during the integration time of the detector 11, as shown in FIG. 3c-f. In other words, each pixel 4 is illuminated through one of the four (1×3) phase masks 8.1-8.4.

When the pattern shown in FIG. 3c 8.1 is used as the phase mask for pixel 4, the light intensity perceived by the detector 11 is $$I_1 = |A_1 + A_2 + A_3|^2  \quad (5)$$

$$= |A_1|^2 + |A_2|^2 + |A_3|^2 + 2A_1 A_2 + 2A_1 A_3 + 2A_2 A_3.$$

where $A_i$ is the random speckle field projected onto the detector 11 by the ith resolution element of the projection lens 6. A more precise way to express $2A_i A_j$ is $A_i^* A_j + A_i A_j^*$, where $A_i^*$ is the conjugate of $A_i$.

When the pattern shown in FIG. 3d 8.2 is used as the phase mask, the light intensity perceived by the detector 11 is $$I_2 = |A_1 - A_2 - A_3|^2  \quad (6)$$

$$= |A_1|^2 + |A_2|^2 + |A_3|^2 - 2A_1 A_2 - 2A_1 A_3 + 2A_2 A_3.$$

When the pattern shown in FIG. 3e 8.3 is used as the phase mask, the light intensity perceived by the detector 11 is $$I_3 = |-A_1 - A_2 - A_3|^2  \quad (7)$$

$$= |A_1|^2 + |A_2|^2 + |A_3|^2 - 2A_1 A_2 + 2A_1 A_3 - 2A_2 A_3.$$

When the pattern shown in FIG. 3f 8.4 is used as the phase mask, the light intensity perceived by the detector 11 is $$I_4 = |-A_1 - A_2 + A_3|^2  \quad (5)$$

$$= |A_1|^2 + |A_2|^2 + |A_3|^2 + 2A_1 A_2 - 2A_1 A_3 - 2A_2 A_3.$$

The total light intensity is the summation of the intensities calculated above $$I = I_1 + I_2 + I_3 + I_4  \quad (9)$$

$$= 4(|A_1|^2 + |A_2|^2 + |A_3|^2).$$

As indicated in Eq. (9), the cross-terms in Eq. (5)~Eq. (8) vanish. Therefore, by four step changes of the phase mask 8 (8.1-8.4), three independent speckle images can be obtained.

Generally, we may assume that a $N_2 N_4 \times N_1 N_3$ OA C is used as the origin of phase mask 7. In this case the mean value of light intensity may be $$\overline{I} = N_2 N_4 \sum_{k=1}^{N_1 N_3} |A_k|^2 = N_1 N_2 N_3 N_4 J_A.  \quad (10)$$

This assumes that all $|A_k|^2$ have the same intensity $J_A$ since the screen 9 properties are substantially spatially constant. In order to find the speckle CR, we also need to know the standard deviation of the light intensity, which can be obtained by $$\overline{I^2} = \overline{\left( N_2 N_4 \sum_{k=1}^{N_1 N_3} |A_k|^2 \right)^2}  \quad (11)$$

$$= N_2^2 N_4^2 \overline{\sum_{k=1}^{N_1 N_3} |A_k|^4 + \sum_{k=1, l=1}^{N_1 N_3} |A_k|^2 |A_l|^2}\bigg|_{k \neq l}$$

$$= N_2^2 N_4^2 [2 N_1 N_3 J_A^2 + ((N_1 N_3)^2 - N_1 N_3) J_A^2]$$

$$= N_2^2 N_4^2 (N_1^2 N_3^2 + N_1 N_3) J_A^2.$$

where the property of negative-exponential statistics for fully developed speckle $\overline{|A|^4} = 2\overline{|A|^2}^2 = 2 J_A^2$ is used. Therefore, the speckle CR is $$CR = \frac{\sqrt{\overline{I^2} - \overline{I}^2}}{\overline{I}}  \quad (12)$$

$$= \frac{\sqrt{N_2^2 N_4^2 (N_1^2 N_3^2 + N_1 N_3) J_A^2 - (N_1 N_2 N_3 N_4 J_A)^2}}{N_1 N_2 N_3 N_4 J_A}$$

$$= \sqrt{\frac{1}{N_1 N_3}}.$$

Therefore, by $N_2 N_4$ changes of phase mask 7 during the integration time of the detector 11, speckle CR may be decreased to $1/\sqrt{N_1N_3}$. In order to apply this two-dimensional phase mask 7 for speckle reduction, mechanical vibration with a large phase mask is necessary. Electrical control of the phase mask 7 is not practical due to the large number of independent electrodes requirement to control such a phase mask 7.

Electrical Control of Two One-Dimensional Orthogonal Phase Masks

Figure 4:
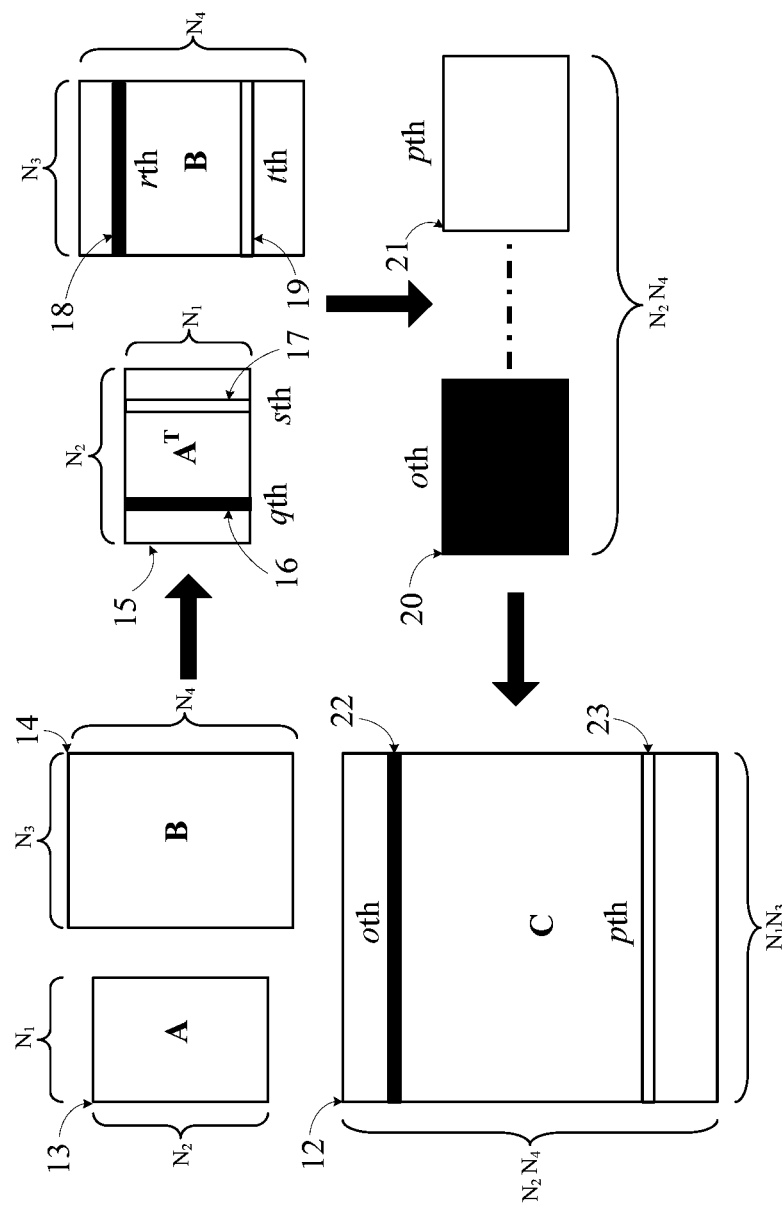

In the following example, there are two OAs A 13 and B 14, as shown in FIG. 4. Their factors are $N_1$ and $N_3$ and their runs are $N_2$ and $N_4$, respectively (count of the runs should preferably be no less than the factors, i.e. $N_2=N_1$ and $N_4=N_3$). The Kronecker Product of OAs A 13 and B 14 is $$C = A \otimes B. \quad (13)$$

where $\otimes$ is the Kronecker delta, and the dimension of C 12 is $N_2N_4 \times N_1N_3$. It can be proved that C 12 is also an OA.

$$\begin{aligned}
C^T C &= (A \otimes B)^T (A \otimes B) \quad (14)\\
&= (A^T \otimes B^T)(A \otimes B)\\
&= A^T A \otimes B^T B\\
&= (N_2 \delta_{i,j})|_{i,j=1 \ldots N_1} \otimes (N_4 \delta_{x,y})|_{x,y=1 \ldots N_3}\\
&= N_2 N_4 \delta_{k,i}|_{k,i=1 \ldots N_1 N_3}.
\end{aligned}$$

In a preferred case, A 13 and B 14 may both be Orthogonal Matrixes (OMs, for example HM) and C 12 can be proved to be a new OM. Eq. (10) can then be rewritten as:

$$\begin{aligned}
C^T C &= A^T A \otimes B^T B \quad (15)\\
&= AA^T \otimes BB^T \Big|_{\substack{A^T A = AA^T \\ B^T B = BB^T}}\\
&= (A \otimes B)(A \otimes B)^T = CC^T.
\end{aligned}$$

The Kronecker Algebra is graphically shown in FIG. 4. $A^T$ 15 is the transpose of OA A 13. Multiplying the qth column 16 of $A^T$ 15 and the rth row 18 of B 14 will construct a $N_1 \times N_3$ matrix 20. It is then transformed to a $1 \times N_1 N_3$ array as the oth row 22 of matrix C 12, where $o=(q-1)/N_4+r$. The same method can be used to form the pth row 23 of matrix C 12, which is derived from the sth column 17 of $A^T$ 15 and tth row 19 of B 14 to form another matrix 21, and $p=(s-1)N_4+t$.

From FIG. 4 it is shown to be possible to construct the two-dimensional OA phase mask M 8 by a pair of one-dimensional phase masks $M_H$ 26 and $M_V$ 27 orthogonally. The construction steps 24 are shown in FIG. 5 and one example is shown FIG. 6, where matrixes A 13, B 14 are OA (4, 3, 2, 2) 9. Each rows of the Kronecker Product C 12 are used sequentially to form the phase patterns M 8, which is derived from the phase pattern 25 generated from matrix C 12.

In a further example, the transmission optical geometry to form phase mask 7 using two one-dimensional orthogonal phase plates 28, 29 is shown in FIG. 7. The first phase mask 28 consists of one-dimensional horizontal ribbons or lines, and the second phase mask 29 consists of one-dimensional vertical ribbons or lines. Vertical and horizontal lines are described and shown for convenience and clarity but other orientations are possible. Cells 26 in the first phase mask 28 are derived from OA B 12 and they are connected to the first control bus 32 by the first sub-control bus 30. There are 1080×3 electrically controlled ribbons or lines in the first phase mask 28 and it is controlled by the first encoder AD1 34 with M1 output ports. Cells 27 in the second phase mask 29 are derived from OA A 11 and they are connected to the second control bus 33 by the second sub-control buses 31. There are 1920×3 electrically controlled ribbons in the second phase mask 29 in this example and it is controlled by the second encoder AD2 35 with M2 output ports.

Figure 8A:
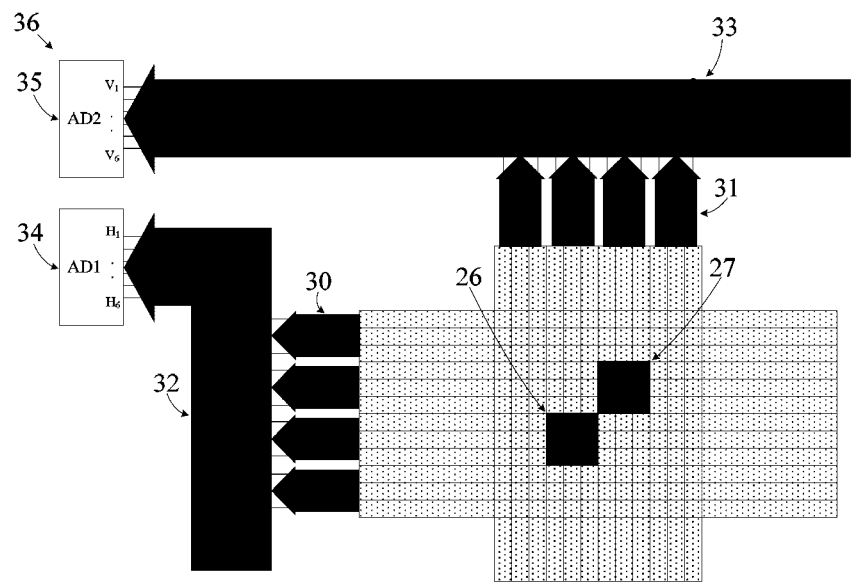
FIG. 8a shows a schematic diagram indicating the flow of electrical signals within the electrical circuit of FIG. 7.

An example electrical control method 36 is shown in FIG. 8a. Sub-control buses 30, 31 connect to the control buses 32, 33 by the corresponding three wires, and then connect to the corresponding output ports of encoder AD1 34 and AD2 35, respectively.

Figure 8B:
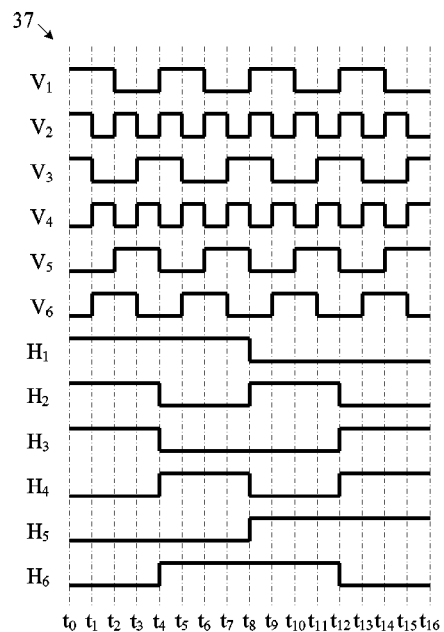
Figure 8C:
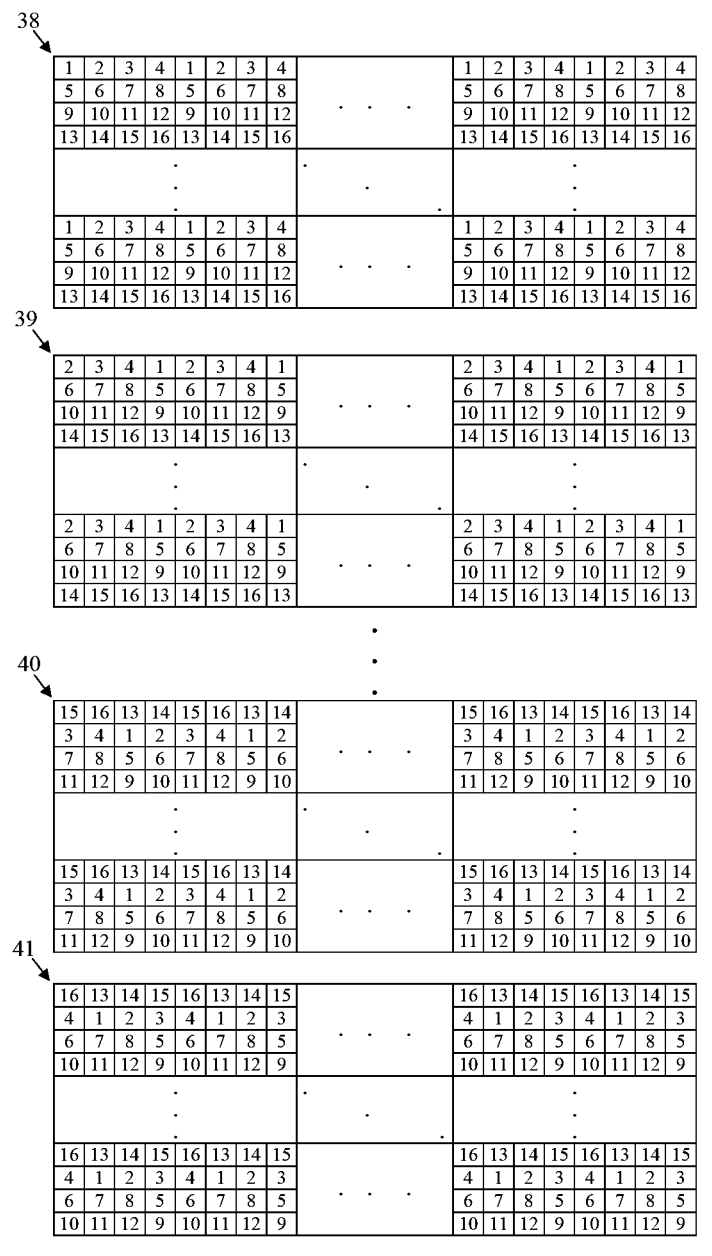

States of the output signal 37 from encoder AD1 34 and encoder AD2 35 are shown in FIG. 8b, which are derived from OA B14 and OA A13. Because the dimension of the product OA C12 from OA A13 and OA B14 is 16×9, sixteen different speckle patterns may be projected onto the corresponding pixel 10 of the screen 9 within the integration time of the detector 11. Speckle distributions at time $t_0$ to $t_1$ 38, $t_1$ to $t_2$ 39, ..., $t_{14}$ to $t_{15}$ 40, $t_{15}$ to $t_{16}$ 41 are shown in FIG. 8c. In FIG. 8c, k (k is 1, 2, 3 ... 16) results in the speckle pattern modulated by the combination of the first cell 26 in the first phase mask 28 and the second cell 27 in the second phase mask 29. It is derived from the kth row of phase pattern 23 and is projected onto the corresponding pixel 10 in the screen 9.

Figure 9A:
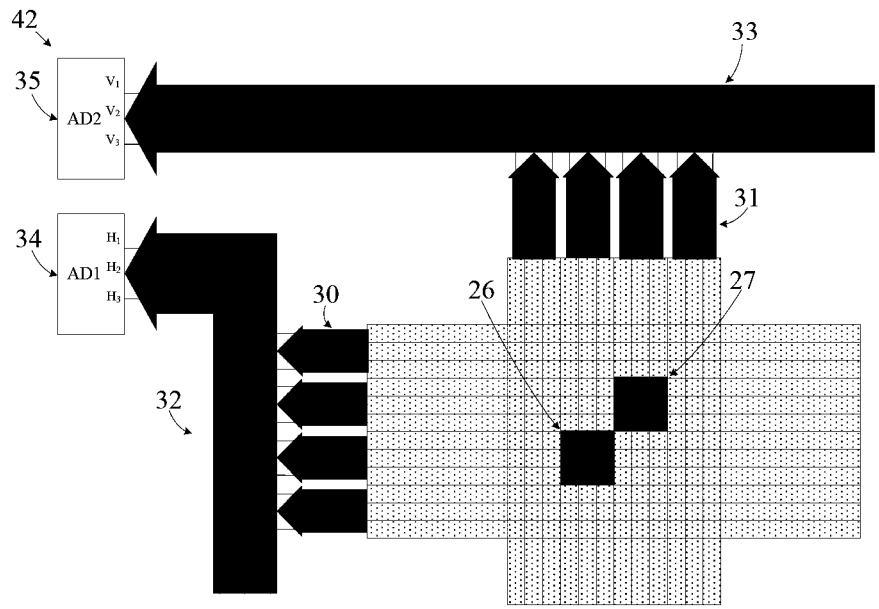
FIG. 9a shows a schematic diagram indicating a further flow of electrical signals within the electrical circuit of FIG. 7.
Figure 9B:
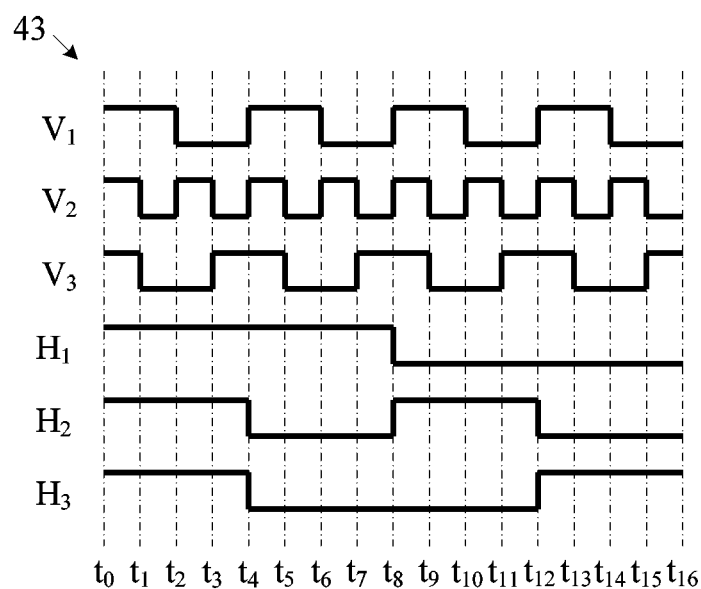
Figure 9C:
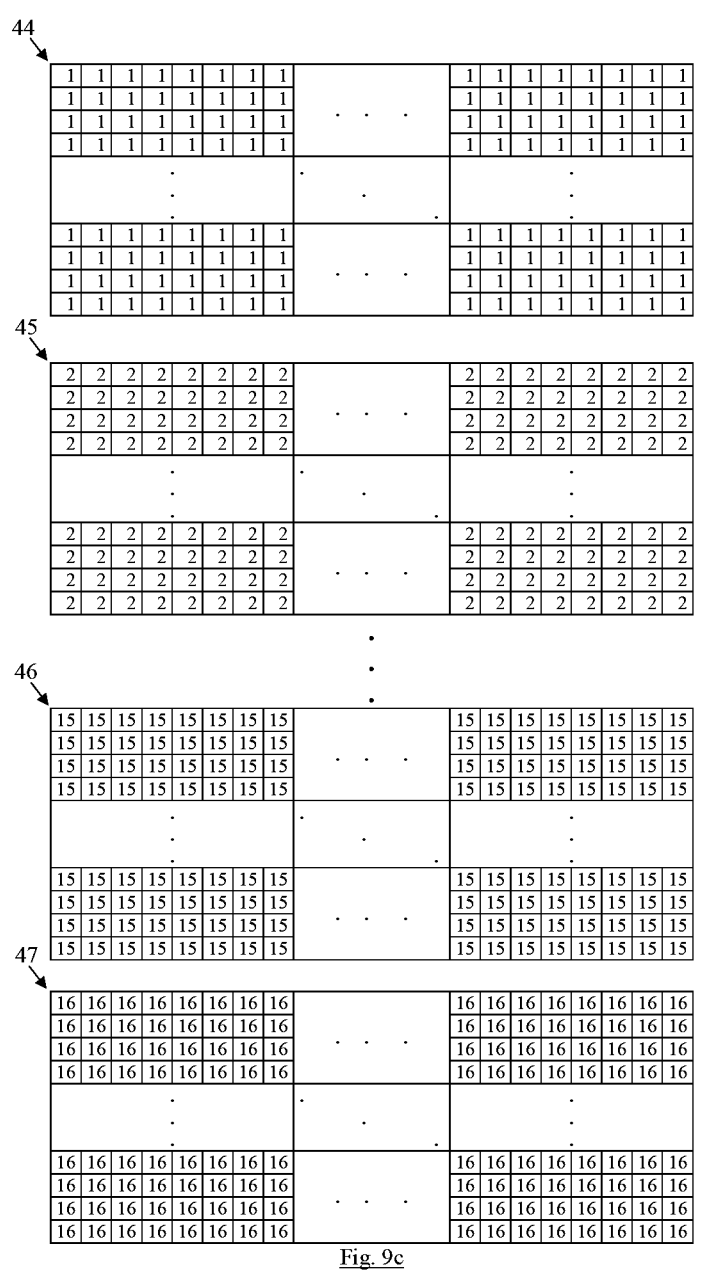

Another electrical control method 42 is shown in FIG. 9a. The states of output signal 43 from encoder AD1 34 and encoder AD2 35 are shown in FIG. 9b. Speckle patterns are the same within the same time period for all the pixels of the screen 9. For example, each of the speckle distributions at time $t_0$ to $t_1$ 44, $t_1$ to $t_2$ 45, ..., $t_{14}$ to $t_{15}$ 46, $t_{15}$ to $t_{16}$ 47 are the same, as shown in FIG. 9c.

Compared with a HM, a binary diffuser generated from OA is more flexible. When the number of projection lens resolution elements within one eye resolution spot is not equal to the order of HM, introducing a HM with a much higher order may make the size of the required diffuser cell even smaller. For laser projectors in particular, because of the small pixel size of the modulation devices, such as grating light valve (GLV), this requires much more accurate fabrication technology to form the diffuser. However, a mask 7 generated as an OA can be used under conditions where a HM mask is not practical.

Figure 6:
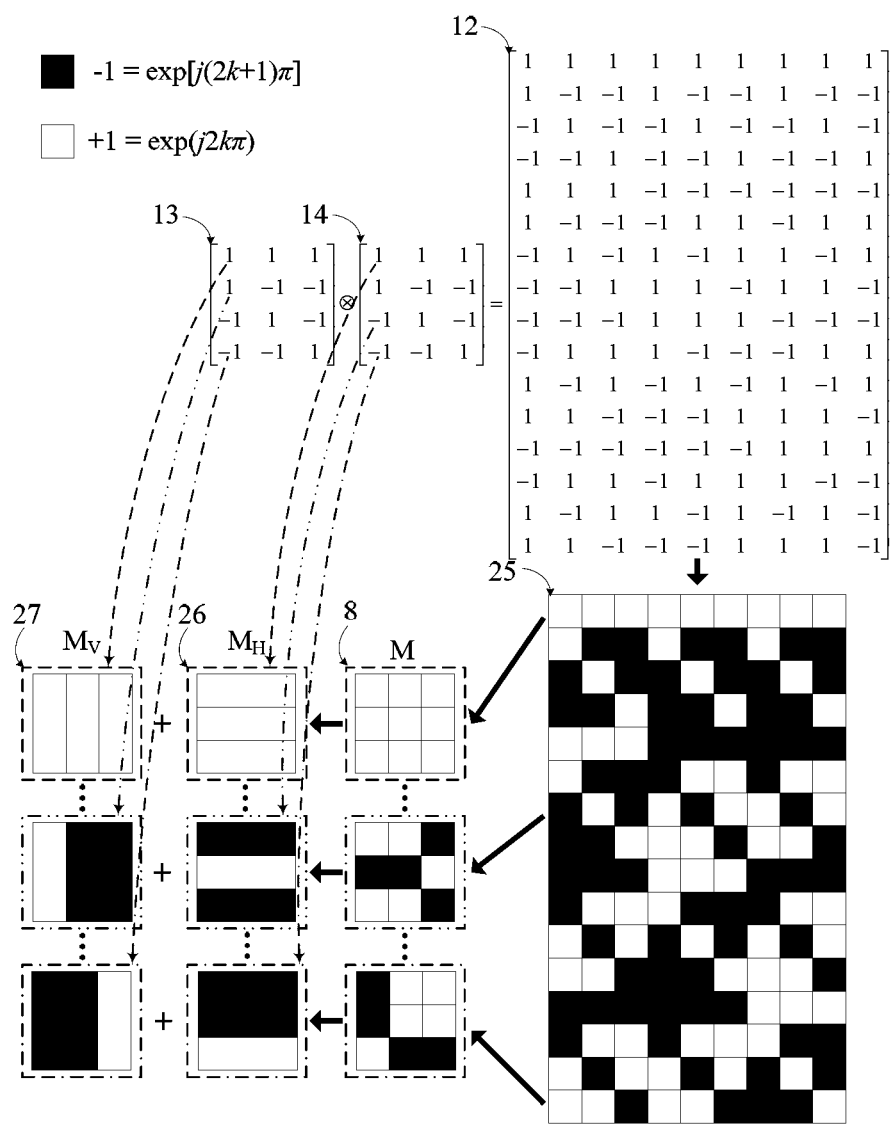
FIG. 6 shows a schematic diagram of the speckle reduction mask of FIG. 3a in the form of two one-dimensional orthogonal arrays.

For example, assume that the number of projection lens resolution elements within one eye resolution spot is 9. There is no HM with order 9 that can be used. Using a higher order HM (that does exist), such as a HM with order 16, for a GLV with 25 μm×25 μm pixel size, the cell size of the required binary diffuser will be about 6 μm×6 μm. However, using an OA with a grid layout of 16×9, as shown in FIG. 6, the required cell size of the binary diffuser 7 will be about 8 μm×8 μm, i.e. easier to manufacture. Furthermore, the OA based (non-square) mask has the same speckle reduction factor as the HM mask, i.e., speckle CR is $1/9^{1/2}=3$ with 16 step changes per integration interval.

Electrical Control of More than Two One-Dimensional Orthogonal Phase Masks

As proved in Eq. (15), the ith row of an N×N HM can be represented by the product of the following two one-dimensional arrays $$A^{(i)} = \begin{bmatrix} k_{i,0\times\sqrt{N}} \\ \vdots \\ k_{i,j\times\sqrt{N}} \\ \vdots \\ k_{i,(\sqrt{N}-1)\times\sqrt{N}} \end{bmatrix}, B^{(i)} = [k_{i,0}, \ldots k_{i,j}, \ldots k_{i,\sqrt{N}-1}]. \quad (16)$$

where i=0, 1, 2 ... N−1, j=0, 1, 2 ... √N−1, and k is either 1 or −b 1.

If the HM is constructed by the Sylvester method, the two-dimensional phase mask can be replaced by more than two one-dimensional phase masks. Taking HM (16) as an example, the ith row of the HM can be rewritten as the product of $A^{(i)}$ and $B^{(i)}$ with four one-dimensional arrays $$A^{(i)} = \begin{bmatrix} k_{i,0} \\ k_{i,4} \\ k_{i,4} \times k_{i,8} \\ k_{i,8} \end{bmatrix} = \begin{bmatrix} k_{i,0} \\ k_{i,4} \\ k_{i,4} \\ k_{i,0} \end{bmatrix} \cdot \begin{bmatrix} k_{i,0} \\ k_{i,0} \\ k_{i,8} \\ k_{i,8} \end{bmatrix} \quad (17)$$

$$B^{(i)} = [k_{i,0} \quad k_{i,1} \quad k_{i,1} \times k_{i,2} \quad k_{i,2}]$$
$$= [k_{i,0} \quad k_{i,1} \quad k_{i,1} \quad k_{i,0}] \cdot [k_{i,0} \quad k_{i,0} \quad k_{i,2} \quad k_{i,2}]$$

Four independent variables exist besides $k_{i,0}$ (which is always 1). Therefore, the number of electrodes can be reduced from eight with two one-dimensional phase masks, to four with four one-dimensional phase masks.

Figure 10:
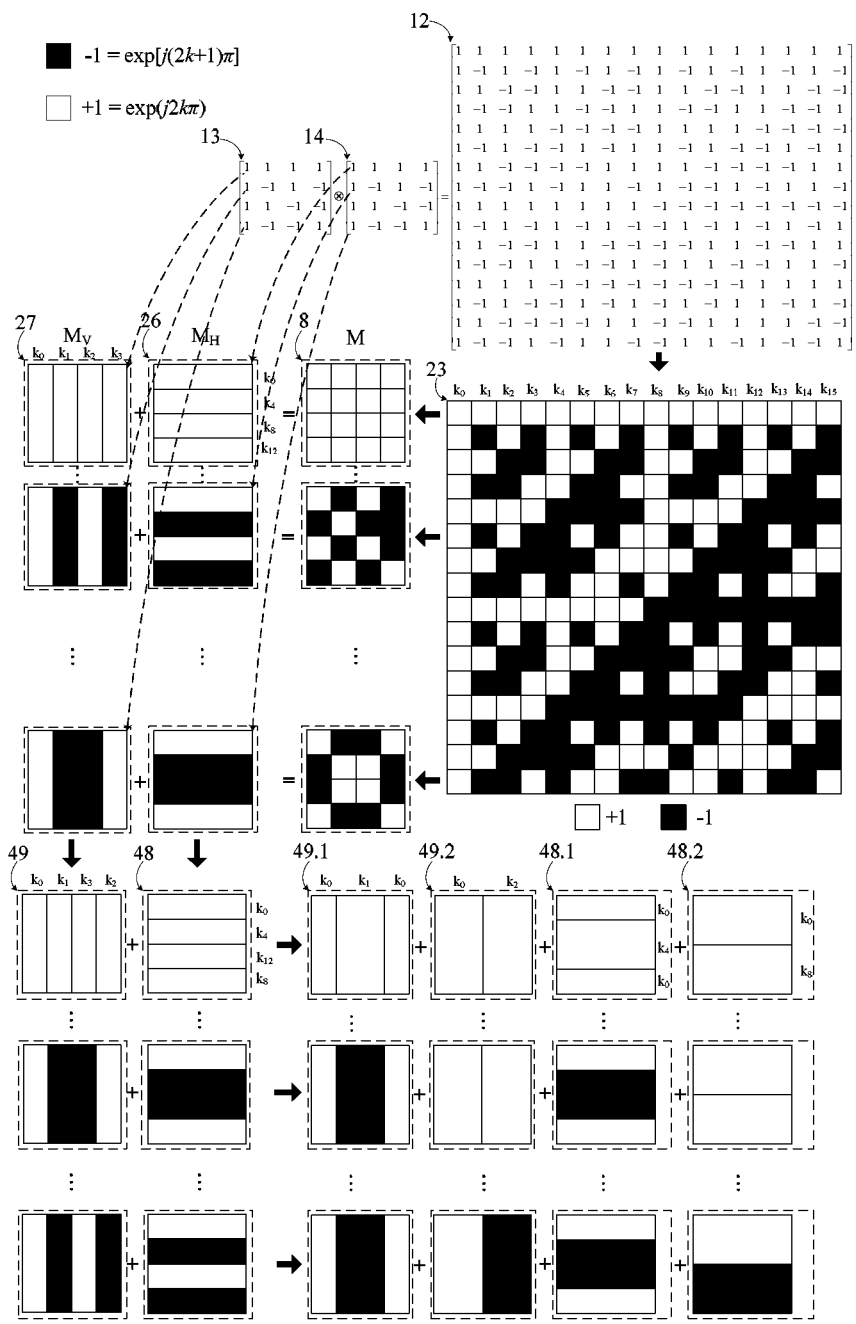
FIG. 10 shows a schematic diagram of the speckle reduction mask of FIG. 2 in the form of four one-dimensional orthogonal arrays.

The phase mask generated by HM (16) is shown in FIG. 10. The higher order HM C 12 is constructed by two lower orders HMs A 13 and B 14. The two-dimensional phase mask M 8 is derived from the phase pattern 23, which is generated from the higher order HM C 12. The phase mask M 8 can be split into two one-dimensional phase masks 26, 27 programmed by lower order HM A and lower order HM B. Since sequence exchanging of the two cells in Eq. (12) does affect the orthogonal property of the masks 8, the two one-dimensional phase masks 26 and 27 may be modified to more simple forms 48, 49. According to Eq. (13), the first one-dimensional mask 48 can be further split into two one-dimensional masks 48.1, 48.2, and the second one-dimensional mask 49 can be further split into two one-dimensional masks 49.1, 49.2. In other words, the phase mask 7 may be formed from four one-dimensional masks 48.1, 48.2, 49.1 and 49.2, which have lines running horizontally and vertically (as shown in FIG. 10 but any orientation may be used). These four one-dimensional masks 48.1, 48.2, 49.1 and 49.2 may be placed in series and have the same effect on incident radiation as a single, more complex, two-dimensional phase mask. Furthermore, four one-dimensional phase masks 48.1, 48.2, 49.1 and 49.2 require far fewer electrical connections (one per line) than the equivalent two-dimensional phase mask that would instead require an electrical connection for each cell.

The transmission optical geometry to form phase mask 7 using four one-dimensional orthogonal phase plates 48.1, 48.2, 49.1, 49.2, is shown in FIG. 11. The first and second phase masks 50.1, 50.2 consist of one-dimensional horizontal ribbons or lines, respectively, and the third and fourth phase masks 51.1, 51.2 consist of one-dimensional vertical ribbons or lines, respectively. According to Eq. (13), cells 48.1, 48.2, 49.1, 49.2 in the phase masks 50.1, 50.2, 51.1, 51.2 are derived from the corresponding rows of the lower order HMs A 13 and B 14. In this example, there are 1080×4 electrically controlled ribbons in the first and second phase masks 50.1, 50.2. The phase pattern is controlled by the encoder AD1 56 with M1 output ports. There are 1920×4 electrically controlled ribbons in the third and fourth phase masks 51.1, 51.2. The phase pattern is controlled by the encoder AD2 54 with M2 output ports.

Figure 12A:
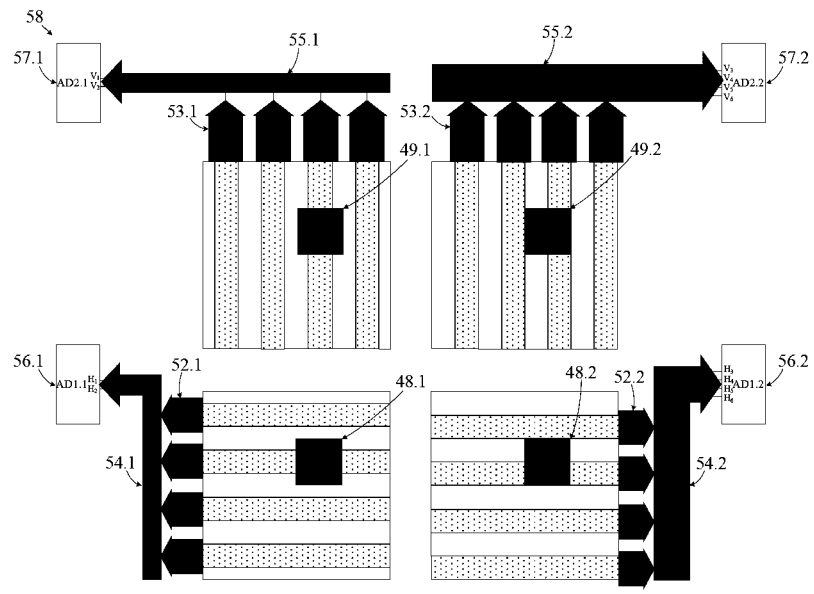
FIG. 12a shows a schematic diagram indicating an example electrical configuration of the electrical signals of FIG. 11.
Figure 12B:
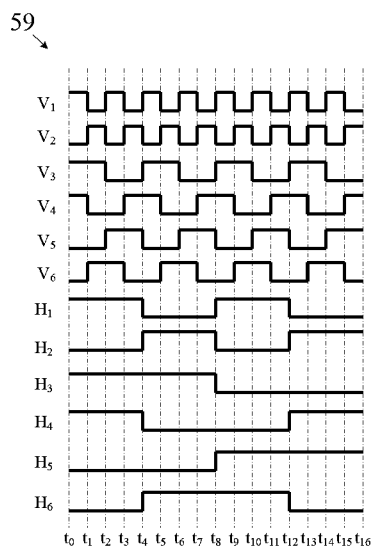

One of the electrical control methods 58 (with 4×4 elements within the phase mask 8) is shown in FIG. 12a. The states of output signals 59 from encoder AD1.1 56.1, encoder AD1.2 56.2, encoder AD2.1 57.1, and encoder AD2.2 57.2, are shown in FIG. 12b. Speckle patterns at different time are the same as shown in FIG. 8c.

Figure 13A:
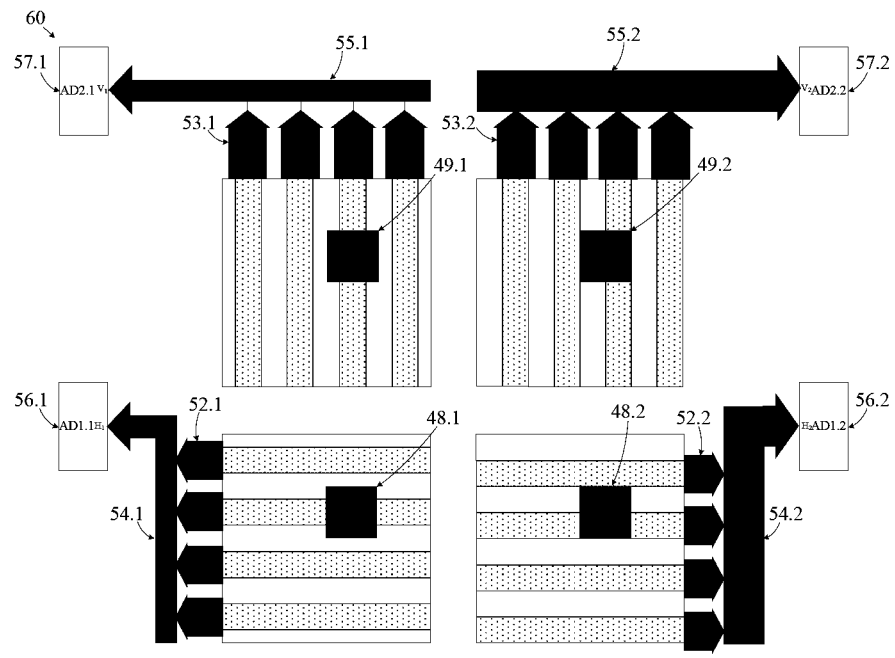
FIG. 13a shows a schematic diagram indicating a further example electrical configuration of the electrical signals of FIG. 11.
Figure 13B:
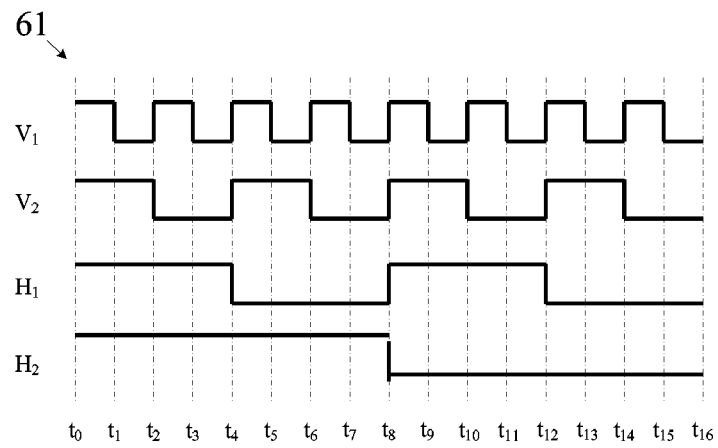

Another electrical control method 60 is shown in FIG. 13a. The states of output signal 61 from encoder AD1.1 56.1, encoder AD1.2 56.2, encoder AD2.1 57.1, and encoder AD2.2 57.2 are shown in FIG. 13b. Speckle patterns at different time are the same as FIG. 9c.

The advantage of replacing one two-dimensional phase mask by several one-dimensional phase masks is more obvious when a higher order HM is utilized. For example, when HM (256) is used, two-hundred-fifty-six controlling electrodes are needed for one two-dimensional phase mask (i.e. one per cell). The number of electrodes requirement is reduced to thirty-two using two one-dimensional phase masks (i.e. 16 lines for each one), and further decreased to twenty-two, eighteen, sixteen when four, six, eight one-dimensional ones are used, respectively. Choosing the particular construction method for the HM phase mask depends on the system demand of specific applications.

Using Kronecker algebra as described above, two OAs with lower orders may be used to construct an OA with a higher order, and a two-dimensional diffuser can be replaced by two one-dimensional ones. The number of individual cells (lines or ribbons) needing to be controlled is greatly decreased, and the ribbon-type cells can be connected to the driving electrodes more easily. This makes controlling a motionless binary phase diffuser electronically simpler. Applications include full-frame projectors, which use a Digital Micromirror Device (DWD). Controlling the diffuser electronically in this way can greatly decrease the driving frequency and power of the actuator (because of the diffuser's larger dimensions).

As will be appreciated by the skilled person, details of the above embodiment may be varied without departing from the scope of the present invention, as defined by the appended claims.

For example, different types of electrical or other control may be used. A combination of mechanical movement and electrical change of pattern may be used.

Many combinations, modifications, or alterations to the features of the above embodiments will be readily apparent to the skilled person and are intended to form part of the invention.

The invention claimed is:

1. A speckle reduction apparatus comprising:
   a radiation path; and
   a speckle reduction mask arranged within the radiation path, the mask comprising an array of cells configured to form a pattern on the mask that varies with time;
   wherein the speckle reduction mask is formed from a first phase mask and a second phase mask arranged in series in the radiation path, the first phase mask comprises $M_1$ electrically controllable parallel lines and the second phase mask comprises $M_2$ electrically controllable parallel lines arranged at a non-zero angle to the parallel lines of the first array; and
   a controller configured to apply a first or second electrical signal to each parallel line of the first and second phase mask to selectively change the phase of radiation incident to each parallel line between a first phase or a second phase, respectively;

wherein the controller is configured to apply the first or second output signal according to an $N_1 \times M_1$ orthogonal array, A, of level factor 2, and an $N_2 \times M_2$ orthogonal array, B, of level factor 2, the controller configured to:

apply to each $M_1$ parallel lines of the first phase mask voltages corresponding to each $M_1$ columns of the orthogonal array A, the applied voltages at the parallel lines of the first phase mask sequentially changed according to each of the $N_1$ rows of the orthogonal array A; and for each increment of the applied voltages at the parallel lines of the first phase mask, apply to each $M_2$ parallel lines of the second phase mask voltages corresponding to each $M_2$ columns of the orthogonal array B, the applied voltages at the parallel lines of the second phase mask sequentially changed according to each of the $N_2$ rows of the orthogonal array B.

2. The speckle reduction apparatus according to claim 1, wherein the second parallel lines are arranged substantially perpendicular to the first parallel lines.

3. The speckle reduction apparatus according to claim 1, wherein the second phase mask is in contact with and overlaid on the first phase mask.

4. The speckle reduction apparatus according to claim 1 further comprising a first control bus connecting each line of the first parallel lines to a controller and a second control bus connecting each line of the second parallel lines to the controller.

5. The speckle reduction apparatus according to claim 1, wherein an overall phase change of radiation passing through each cell of the speckle reduction mask is 0 or $\pi$ rad.

6. The speckle reduction apparatus according to claim 1, wherein the mask is a transmission mask or a reflection mask.

7. The speckle reduction apparatus according to claim 1, wherein the cells of the speckle reduction mask have two states.

8. The speckle reduction apparatus according to claim 1, wherein the pattern on the mask that varies with time includes a Hadamard matrix or an orthogonal array.

9. The speckle reduction apparatus according to claim 1, wherein the speckle reduction mask is formed from a material selected from the group consisting of ceramic, para-electric, silica and glass.

10. The speckle reduction apparatus according to claim 1 further comprising a beam expander within the radiation path.

11. The speckle reduction apparatus according to claim 1, wherein the speckle reduction mask is located substantially at an intermediate image plane within the radiation path.

12. An imaging device comprising the speckle reduction apparatus according to claim 1 wherein the imaging device further comprises at least one of a laser display, a laser printer, a laser lithography apparatus, a microwave radar apparatus, and an ultrasound image.

13. The speckle reduction apparatus of claim 1, wherein the pattern is one of a phase pattern and an intensity pattern.

14. The speckle reduction apparatus of claim 1, wherein the mask is arranged to be stationary with respect to the radiation path.

15. The speckle reduction apparatus according to claim 1, wherein the array of cells comprises a different number of rows to the number of columns.

16. The speckle reduction apparatus according to claim 1 further comprising electrodes connectable between each cell in the mask and a controller.

17. The speckle reduction apparatus of claim 16, further comprising a control bus connecting the electrodes to the controller.

* * * * *